Dec. 7, 1954

A. A. COSTER 2,696,595

MOUNT FOR ELECTRONIC DISCHARGE DEVICES

Filed April 13, 1954

*INVENTOR.*
ALLAN A. COSTER
*BY*
Ervin B. Steinberg
agent

United States Patent Office 2,696,595

Patented Dec. 7, 1954

2,696,595

MOUNT FOR ELECTRONIC DISCHARGE DEVICES

Allan A. Coster, Lewisboro, N. Y., assignor to The Reflectone Corporation, Stamford, Conn., a corporation of Connecticut Application April 13, 1954, Serial No. 422,851

3 Claims. (Cl. 339—112)

This invention relates to a mount for electronic discharge devices and for components associated with said devices. The invention has particular reference to providing a mount for small electronic tubes, commercially known as "subminiature" tubes which are being furnished without plug-in base.

The increasing trend toward subminiaturization of electronic circuits has brought with it the problem of providing suitable means for convenient mounting of electronic tubes and of circuit components associated therewith. It is well known further that the problem of suitable heat transfer from small components is a formidable one. Subminiature electronic tubes for instance, which are cylindrical in their appearance, having a diameter of about ¼ to ⅜ inch and a length of 1 to 2 inches, may operate at a temperature of 200 to 300 centigrade at their envelopes. This high operating temperature contributes to a shortening of their life expectancy and it is necessary therefore to provide cooling means so as to reduce the envelope temperature. The mechanical mounting of such tubes is a further consideration which is of greatest concern to the designers of electronic equipment for the reason that this type of tube is usually furnished without a plug-in base. Flexible leads extend through the base of the tube which must be terminated at a convenient circuit junction.

Since electronic tubes operate in conjunction with circuit components such as resistors, capacitors, inductances, etc., it is desirable to bring the tubes and components in such proximity to each other that the shortest possible connecting leads may be employed in order to avoid lead inductances which are particularly undesirable at higher frequencies. Some of these problems were pointed out in a recent article entitled "Subminiature Electron Tubes are Reliable" by E. B. Steinberg et al, Electrical Manufacturing magazine, September 1952.

One of the primary objects of this invention is the provision of a convenient mounting means for electronic discharge devices of the type described above.

A further object of the invention is the provision of a mount for an electronic discharge device which serves to cool the device so as to reduce its operating temperature.

A still further object of the invention is the provision of a mount into which the electronic discharge device may be readily inserted and withdrawn.

Another object of the invention is to provide a mount for an electronic discharge device which has integral terminals for terminating the flexible circuit leads of the electronic discharge device.

A further and other object of the invention is to provide a mount which permits the mounting of circuit components in close proximity to the electronic discharge device.

These objects are accomplished in this invention by providing a pair of side plates, each plate having two side flanges and an elongated semi-tubular, outwardly oriented impression intermediate said flanges. The plates are fastened together at their side flanges so as to produce an elongated substantially tubular aperture into which the electronic discharge device is inserted. A pair of device engaging members are disposed between the side plates, each engaging member having a side flange firmly retained between the flanges of said plates and having also an elongated semi-tubular portion inside of the aperture. The tubular portions of the engaging members are of a height substantially as great as that of the discharge device and formed so as to substantially enclose said device and embrace said device in heat conductive engagement over a portion of the area of said device. At least one of the side flanges of said plates is equipped with a plurality of electrical circuit insulating bushings for fastening electrical circuit components thereto.

Other and further objects of the present invention will be disclosed in the course of the following specification, reference being made to the accompanying drawings.

Figure 1:
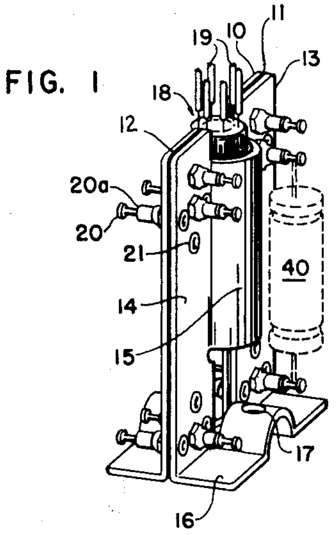
Figure 1 is a perspective view of the mount with an electronic discharge device inserted therein and a typical electronic circuit component (shown by dotted lines) fastened thereon.

Referring now to Figure 1, numerals 10 and 13 identify two metallic side plates. Each side plate is equipped with two substantially flat side flanges 14 and an elongated, semi-tubular, outwardly oriented impression 15 which is disposed intermediate the side flanges. The side plates are fastened together by means of rivets 21 which extend through corresponding apertures in the flange portions 14 of the plates. The side flanges 14 of each plate are equipped also with a plurality of electrical circuit insulating bushings 20, each bushing having an insulating portion 20a made of ceramic or some other suitable insulating material.

Figure 2:
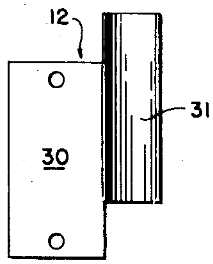
Figure 2 is a front elevation view of the electronic discharge device engaging member.
Figure 3:
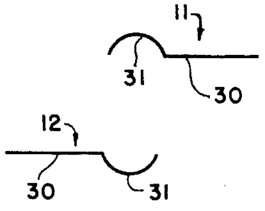
Figure 3 is a plan view of two spaced device engaging members.

Two electronic discharge device engaging members 11 and 12 are disposed between the side plates 10 and 13, the construction of the engaging members being shown more clearly in Figures 2 and 3. Each engaging member is equipped with a flat flange portion 30 and an elongated semi-circular portion 31 which is shaped to engage the electronic discharge device 18 (Figure 1). The flange portions 30 are firmly retained between the side flanges 14 of the side plates 10 and 13 so as to establish a good thermal path therewith. The engaging members are made of thin resilient metallic material such as beryllium copper or Phosphor bronze in order to not only engage and frictionally retain the electron discharge device but also to conduct heat therefrom. Figure 3 shows the complementary arrangement of the engaging members so as to retain the electronic discharge device 18 when flanges 30 of engaging members 11 and 12 are mounted in a common plane, i. e. clamped between assembled plates 10 and 13. It will be apparent that the portions 31 may be slotted radially to obtain a finger-like structure which renders greater flexibility, a construction which is particularly advantageous for uneven surfaces.

A typical electronic discharge device, such as a subminiature tube 18, is shown partially inserted into the instant mount, see Figure 1. The subminiature tube is equipped with flexible leads 19 which can be terminated by soldering to the circuit insulating bushings 20. Furthermore, the mount provides sufficient space to accommodate electrical circuit components which are associated with the tube such as a tubular capacitor 40, shown by dotted lines, and supported between two-spaced insulating bushings in close proximity to the electronic tube, thereby minimizing lead inductance and separate circuit wires. A bent-over mounting flange 16 which is integral with the side plate serves as a mounting base for the instant mount. Aperture 17 within the mounting flange 16 accommodates the necessary mounting screw.

Figure 4:
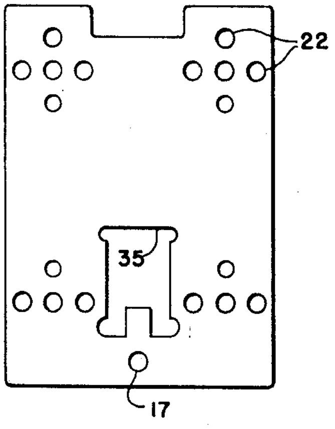
Figure 4 is a view of the metal blank employed for fabricating a part of the mount.

The sheet metal blank from which the side plates 10 and 13 are fabricated is shown in Figure 4. Apertures 22 serve to either receive rivets for fastening the flanges together or to receive the electrical insulating bushings 20. Aperture 17 is the mounting hole and aperture 35 is provided in order that the semi-tubular portion 15 and the mounting flange 16 may be formed by means of a simple forming die.

Figure 5:
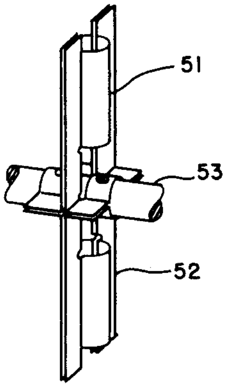
Figure 5 is a perspective view illustrating a typical mode of mounting two mounts using a minimum of space.

The mount may be fastened in various ways to circuit chassis, for instance the flange 16 is adapted to be mounted against a flat surface as apparent in Figure 1. However, by virtue of the radius in the mounting flange 16, the mount may be mounted also to a round bar 53 as illustrated in Figure 5, which shows two mounts 51 and 52 arranged in close proximity to one another requiring a minimum of space and of supporting structure.

It will be apparent from the foregoing description that the instant mount is a unitary device adapted to (a) retain an electronic discharge device, (b) reduce the operating temperature of the device by way of conductive cooling, (c) facilitate terminating of lead-in conductors, and (d) provide space for mounting electronic circuit components in close proximity to the device. By virtue of the design all parts of the mount may be fabricated from sheet metal material in a very simple and inexpensive manner.

While there has been described and illustrated a specific embodiment of the invention, it will be obvious to those skilled in the art that various changes and modifications may be made therein without departing from the field of the present invention which should be limited only by the scope of the appended claims.

What is claimed is:

1. A mount for an electronic discharge device comprising a pair of side plates; each plate having two side flanges and an elongated semi-tubular outwardly oriented impression intermediate said flanges; said plates fastened together at their side flanges thereby producing an elongated substantially tubular aperture into which the electronic discharge device is inserted; a pair of device engaging members disposed between said side plates; each engaging member having a side flange firmly retained between the flanges of said plates and also an elongated semi-tubular portion inside of said aperture and substantially concentric therewith; the tubular portions of said engaging members being of a height substantially as great as that of the discharge device and formed so as to substantially enclose said device and embrace said device in heat conductive engagement over a large portion of the area of said device; and at least one of the side flanges of said plates equipped with a plurality of electrical circuit insulating bushings for fastening electrical circuit components thereto.

2. A heat conductive mount for an electronic discharge device comprising a pair of substantially rigid, heat conductive side plates; each plate having two side flanges and an elongated semi-tubular outwardly oriented impression intermediate said flanges; said plates fastened together at their side flanges thereby producing an elongated substantially tubular aperture into which the electronic discharge device is inserted; a pair of device engaging substantially flexible members disposed between said side plates; each engaging member having a side flange firmly retained between the flanges of said plates and also an elongated semi-tubular portion inside of said aperture and substantially concentric therewith; the tubular portions of said engaging members being of a height substantially as great as that of the discharge device and formed so as to substantially enclose said device and frictionally embrace said device in heat conductive engagement over a large portion of the area of said device; and at least one of the side flanges of said plates equipped with a plurality of electrical circuit insulating bushings for fastening electrical circuit components thereto.

3. A heat conductive mount for an electronic discharge device comprising a pair of substantially rigid, metallic side plates; each plate having two side flanges and an elongated semi-tubular outwardly oriented impression intermediate said flanges; said plates fastened together at their side flanges thereby producing an elongated substantially tubular aperture into which the electronic discharge device is inserted; a pair of device engaging substantially flexible metallic members disposed between said side plates; each engaging member having a side flange which is firmly retained between the flanges of said plates and conductively transfers thermal energy thereto and having also an elongated semi-tubular portion inside of said aperture and substantially concentric therewith; the tubular portions of said engaging members being of a height substantially as great as that of the discharge device and formed so as to substantially enclose said device and frictionally embrace said device in heat conductive engagement over a large portion of the area of said device; the side flanges of said plates equipped with a plurality of electrical circuit insulating bushings for fastening electrical circuit components thereto, and at least one of said plates equipped with an apertured mounting flange.

No references cited.